United States Patent
Ko

(10) Patent No.: US 7,489,534 B2
(45) Date of Patent: Feb. 10, 2009

(54) SEMICONDUCTOR PACKAGE FOR FORMING A DOUBLE DIE PACKAGE (DDP)

(75) Inventor: Bok Rim Ko, Icheon-si (KR)

(73) Assignee: Hynix Semiconductor Inc., Icheon-si (KR)

(*) Notice: Subject to any disclaimer, the term of this patent is extended or adjusted under 35 U.S.C. 154(b) by 46 days.

(21) Appl. No.: 11/812,840

(22) Filed: Jun. 22, 2007

(65) Prior Publication Data

US 2008/0253216 A1  Oct. 16, 2008

(30) Foreign Application Priority Data

Apr. 10, 2007  (KR) .................... 10-2007-0035054

(51) Int. Cl.
G11C 5/00 (2006.01)
G11C 7/00 (2006.01)
G11C 8/00 (2006.01)

(52) U.S. Cl. .................... 365/52; 365/189.05; 365/194; 365/230.03; 365/230.08; 365/236

(58) Field of Classification Search .................. 365/52, 365/189.05, 194, 230.03, 230.08, 233.1, 365/233.12, 233.13, 236
See application file for complete search history.

(56) References Cited

U.S. PATENT DOCUMENTS 7,227,251 B2 * 6/2007 Sakuma et al. ......... 365/233.12
7,379,380 B2 * 5/2008 Sohn et al. ............. 365/230.08

* cited by examiner

*Primary Examiner*—Trong Phan
(74) *Attorney, Agent, or Firm*—Finnegan, Henderson, Farabow, Garrett & Dunner, L.L.P.

(57) ABSTRACT

A semiconductor package for forming a Double Die Package (DDP) with a plurality of single chips includes: a buffer configured to buffer an external address to generate a row address which is defined only in a DDP mode; a column address control unit configured to replace the row address with a column address, which is defined only in the DDP mode, in a single chip mode; and a read operation control unit configured to output a bank read signal latched in an active bank in a read mode of the DDP, and to selectively activate a first address control signal and a second address control signal for activating a bank selected from the single chip or the DDP in response to the bank read signal.

20 Claims, 5 Drawing Sheets

SEMICONDUCTOR PACKAGE FOR FORMING A DOUBLE DIE PACKAGE (DDP)

RELATED APPLICATION

The present application claims the benefit of priority of Korean patent application number 10-2007-35054, filed on Apr. 10, 2007, the entire contents of which are incorporated herein by reference.

BACKGROUND

The present invention generally relates to a semiconductor package, and more specifically, to a technology of facilitating formation of a Double Die Package (DDP) with many single chips.

Due to high performance of electronic devices, various techniques for providing semiconductor modules of high capacity have been developed. In order to enhance the capacity of semiconductor modules, high integration of devices, stack-structured packaging methods, and methods for reducing the package size to mount more packages on a printing circuit board have been provided. As a result, various kinds of packages, such as Thin Small Outline Package (TSOP), Fine Pitch Ball Grid Array (FBGA), and Multi Chip Package (MCP), have been developed.

Also, due to speed-up and scale-down of the multimedia system, the component parts thereof become smaller. For example, semiconductor integrated circuits (IC) become smaller through reduction of memory chips, and several chips are mounted in one package to increase board packing efficiency.

A packaging technology has been developed to reduce a package size by mounting more packages on a limited substrate. For example, a chip scale package including a semiconductor chip which occupies 80% of the whole package has been suggested.

Chip Scale Package increases the number of mountable packages due to size reduction thereof. However, it is difficult to increase the capacity and embody a high-capacity system because a semiconductor chip is mounted in a package.

A stack package and a DDP for mounting two or more semiconductor chips in a package have been developed to increase the capacity of the package as well as to reduce the package size. Stack Package and DDP are more efficient in mounting density and mounting area than a general semiconductor package, enabling a system having a higher capacity.

SUMMARY

Embodiments consistent with the present invention are directed to facilitating generation of an address of a DDP which is not defined in the specifications of a single chip with an external address when a DDP is embodied with many single chips to increase the efficiency of the DDP.

Consistent with an embodiment of the present invention, a semiconductor package for forming a Double Die Package (DDP) with a plurality of single chips is provided. The semiconductor package comprises a buffer configured to buffer an external address to generate a row address which is defined only in a DDP mode; a column address control unit configured to replace the row address with a column address, which is defined only in a single chip mode; and a read operation control unit configured to output the row address latched in an active bank as a bank read signal in a read mode of the DDP, and to selectively activate a first address control signal and a second address control signal for activating a bank selected from the single chip or in the DDP in response to the bank read signal.

DETAILED DESCRIPTION

Embodiments consistent with the present invention will be described in detail with reference to the accompanying drawings.

In an embodiment consistent with the present invention, a Double Die Package (DDP) is embodied with many single chips to increase the memory capacity. The memory density is determined by an external address. When an address defined in the specifications of a single chip is different from that of a chip embodied with the DDP, a row address is replaced with a column address, and vice versa, to be interchangeable with each other.

[Table 1] below shows addresses defined in a particular Joint Electron Device Engineering Council (JEDEC) specifications.

TABLE 1

| 1 TEM | | 256 M | 512 M | 1 G |
|---|---|---|---|---|
| row address | ×8 | A0~A12 | A0~A12 | A0~A13 |
| | ×16 | A0~A12 | A0~A12 | A0~A13 |
| | ×32 | A0~A11 | A0~A12 | A0~A12 |
| column address | ×8 | A0~A9 | A0~A9, A11 | A0~A9, A11 |
| | ×16 | A0~A8 | A0~A9 | A0~A9 |
| | ×32 | A0~A8 | A0~A8 | A0~A9 |

In this embodiment, a DDP of 1G (Gigabyte)×16 is exemplified with two chips of 512M (Megabyte)×8 (Data Bandwidth). However, the present invention is not limited to the embodiments presented herein, but a DDP chip with many memory chips having 256M, 512M, 1G, or other capacity are obtained.

As shown in Table 1, in the chip of 512M×8, row addresses are defined as A0~A12, and column addresses are defined as A0~A9, A11. In the DDP chip of 1G×16, row addresses are defined as A0~A13, and column addresses are defined as A0~A9.

Row address A13 defined in the chip of 1G×16 is not defined in the specifications of 512M×8. Column address A11 defined in the chip of 512M×8 is not defined in the specifications of 1G×16. When the DDP chip of 1G×16 includes two chips of 512M×8, the externally inputted address A13 is replaced with a column address.

For this replacement, a circuit includes an address added by analyzing the specifications of the product having larger memory capacity, twice that of a product to be developed in consideration of the DDP. As mentioned above, the added address in the DDP chip of 1G×16 including two chips of 512M×8 is row address A13.

Figure 1:
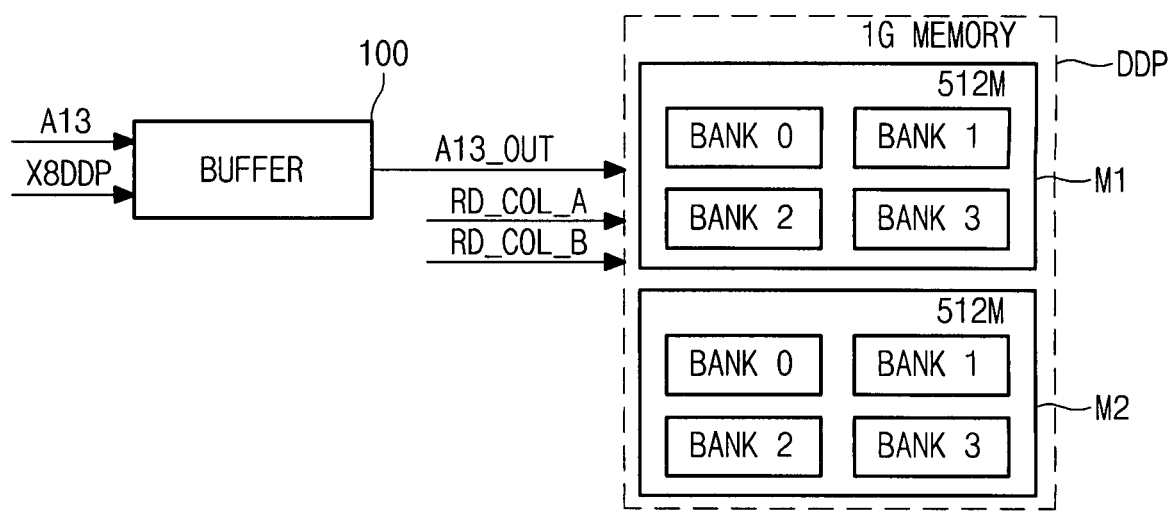
FIG. 1 is a diagram illustrating a semiconductor package consistent with an embodiment of the present invention.

FIG. 1 illustrates a semiconductor package consistent with an embodiment of the present invention.

The semiconductor package of FIG. 1 is configured to be operated as a single chip or a DDP chip in a 1G×16 DDP chip including two 512M×8 chips M1 and M2. When the package is operated as a 512 single chip in the DDP structure, external address A13 is not operated as a physical address. External address A13 is used only when the package is operated as a DDP chip.

When the 1G×16 DDP chip includes two 512M×8 chips M1 and M2, address A13 required in the 1G DDP chip is activated. A buffer 100 buffers external address A13 and a mode control signal X8DDP for selectively activating the 512M×8 as a single chip to output a DDP activating signal A13_OUT.

Buffer 100 disables DDP activating signal A13_OUT when mode control signal X8DDP is inactivated in a 512M chip mode. Otherwise, buffer 100 enables DDP activating signal A13_OUT when mode control signal X8DDP is activated in a 1G DDP chip mode.

External address A13 is inputted through an added address pad (not shown). Buffer 100 buffers external address A13 received through the address pad to output DDP activating signal A13_OUT.

Figure 2:
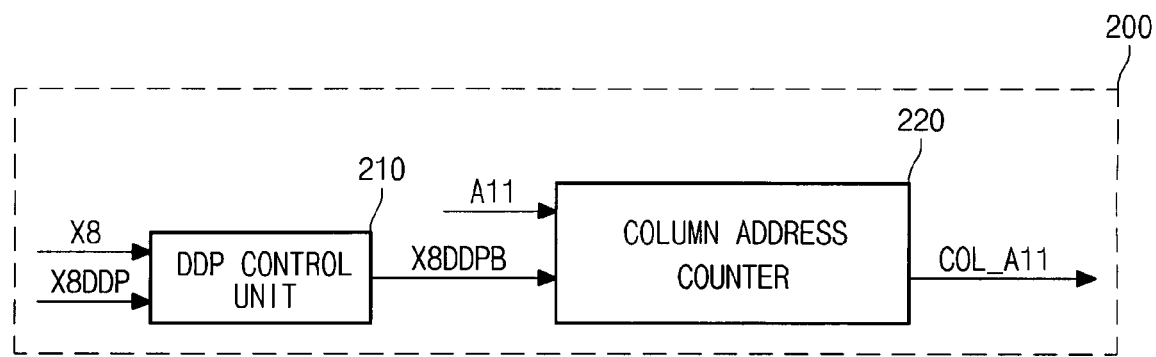
FIG. 2 is a diagram illustrating a column address control unit consistent with an embodiment of the present invention.

FIG. 2 illustrates a column address control unit 200 consistent with an embodiment of the present invention.

Column address control unit 200 includes a DDP control unit 210 and a column address counter 220.

Mode control signal X8DDP is inactivated in the 512M chip mode. Since the data bandwidth is ×8 in the 512M chip, a mode signal X8 is activated. As a result, mode control signal X8DDPB outputted from DDP control unit 210 is activated. Mode control signal X8DDP has an opposite phase to that of a mode control signal X8DDPB.

Mode control signal X8DDPB is activated so that row address A13 is replaced with a column address code signal COL_A11 when the 512M single chip is operated. Column address counter 220 counts column address A11 and mode control signal X8DDPB received from DDP control unit 210.

In the 512M chip mode, if mode control signal X8DDPB is activated, row address A13 is used as a column address of the 512M chip. Column address code signal COL_A11 is inactivated to disconnect internal column address A11. A general switching unit (not shown) and a general selecting unit (not shown) disconnects column address A11, and replaces row address A13 with a column address.

Row address A13 is used as a column address so that one of 512M chips M1 and M2 is selected depending on whether row address A13 becomes "0" or "1". For example, upper 512M chip M1 is selected when row address A13 is "0", and lower 512M chip M2 is selected when row address A13 is "1".

Figure 3:
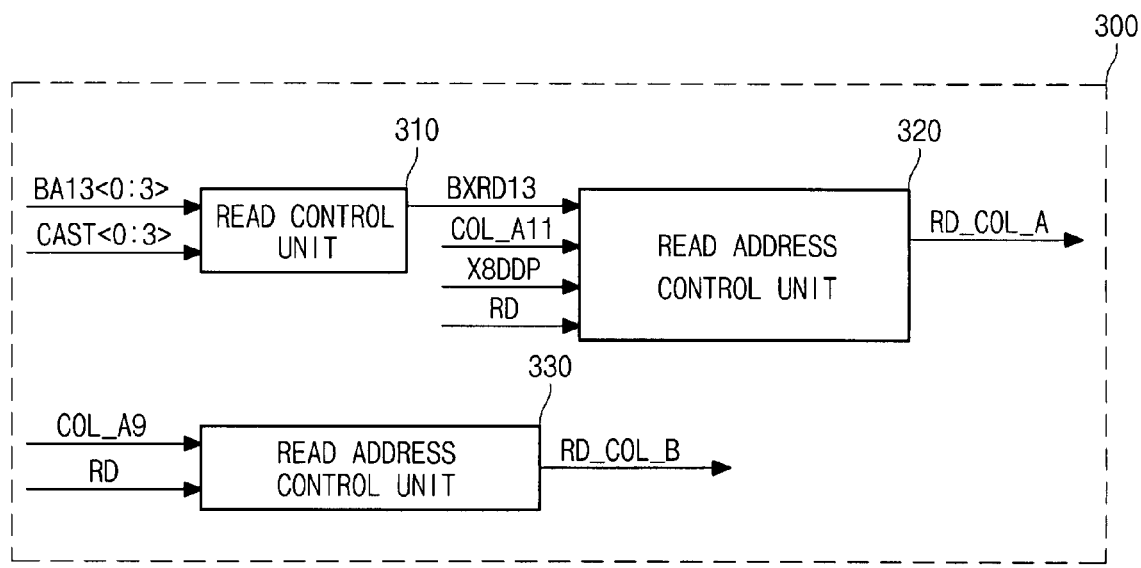
FIG. 3 is a diagram illustrating a read operation control unit consistent with an embodiment of the present invention.

FIG. 3 illustrates a read operation control unit 300 consistent with an embodiment of the present invention.

Read operation control unit 300 includes a read control unit 310, a read address control unit 320, and a read address control unit 330.

Read control unit 310 receives a bank address BA13<0:3> and a CAS signal CAST<0:3> to output address A13 latched in each bank as a bank read signal BXRD13. Bank address BA13<0:3> includes active signals in four banks BANK 0, BANK 1, BANK 2 and BANK 3 and row address information in each bank. That is, bank address BA13<0:3>judges in which bank of four banks row address 13 is activated. That is, CAS signal CAST<0:3> includes column address information which becomes active in write/read operations.

Read address control unit 320 outputs an address control signal RD_COL_A in response to bank read signal BXRD13, column address code signal COL_A11, mode control signal X8DDP, and a read signal RD. Read address control unit 330 outputs an address control signal RD_COL_B in response to a column address code signal COL_A9 and read signal RD.

In a read mode of the 512M×8 chips, the corresponding data are transmitted by column address code signals COL_A9 and COL_A11. Column address code signal COL_A9 is an externally inputted control signal for controlling column address A9 in the operation of the 512M chip. That is, mode control signal X8DDP and bank read signal BXRD13 are inactivated in the read mode of the 512M×8 chip.

Read address control unit 320 activates address control signal RD_COL_A including information of column address code signal COL_A11. In the read mode of 512M×8 chip, read address control unit 330 activates address control signal RD_COL_B including information of column address code signal COL_A9.

When mode control signal X8DDP is activated in a DDP mode, column address code signal COL_A11 is inactivated and bank read signal BXRD13 is activated. As a result, the read operation is controlled not by column address A11 but by row address A13. That is, in the DDP mode, read address control unit 320 activates address control signal RD_COL_A including information of bank read signal BXRD13.

Figure 4:
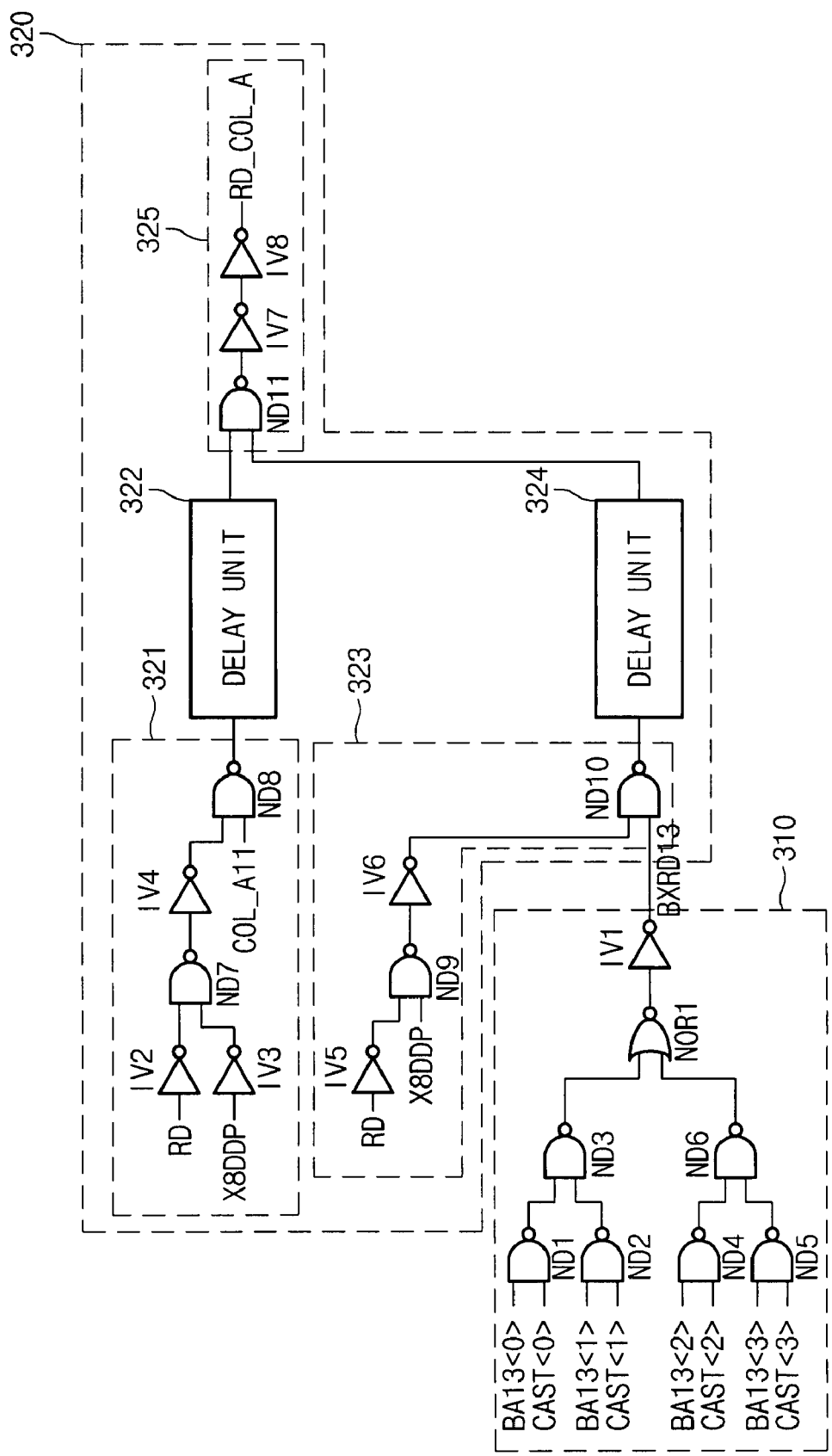
FIG. 4 is a circuit diagram illustrating a read control unit and a read address control unit of FIG. 3.

FIG. 4 illustrates read control unit 310 and read address control unit 320 of FIG. 3.

Read control unit 310 includes a plurality of NAND gates ND1~ND6, a NOR gates NOR1 and an inverter IV1. NAND gates ND1~ND5 perform NAND operations on bank address BA13<0:3> and CAS signal CAST<0:3>. NAND gate ND3 performs a NAND operation on output signals of NAND gates ND1 and ND2. NAND gate ND6 performs a NAND operation on output signals of NAND gates ND4 and ND5. NOR gate NOR1 performs a NOR operation on output signals of NAND gates ND3 and ND6. Inverter IV1 inverts an output signal of NOR gate NOR1 to output bank read signal BXRD13.

Read address control unit 320 includes a first logic combination unit 321, a delay unit 322, a second logic combination unit 323, a delay unit 324, and a third combination unit 325.

First logic combination unit 321 includes a plurality of inverters IV2~IV4 and a plurality of NAND gates ND7~ND8. An inverter IV2 inverts read signal RD. An inverter IV3 inverts mode control signal X8DDP. NAND gate ND7 performs a NAND operation on output signals of inverters IV2 and IV3. NAND gate ND8 performs a NAND operation on an output signal of inverter IV4 and column address code signal COL_A11. Delay unit 322 delays an output signal of NAND gate ND8 for a given time.

Second logic combination unit 323 includes an inverter IV5 and a plurality of NAND gates ND9 and ND10. Inverter IV5 inverts read signal RD. NAND gate ND9 performs a NAND operation on an output signal of inverter IV5 and mode control signal X8DDP. NAND gate ND10 performs a NAND operation on an output signal of inverter IV6 and bank read signal BXRD13. Delay unit 324 delays an output signal of NAND gate ND10 for a given time.

Third logic combination unit 325 includes a NAND gate ND11 and inverters IV7 and IV8. NAND gate ND11 performs a NAND operation on output signals of delay units 322 and 324. Inverters IV7 and IV8 drive an output signal of NAND gate ND11 to output address control signal RD_COL_A.

Figure 5:
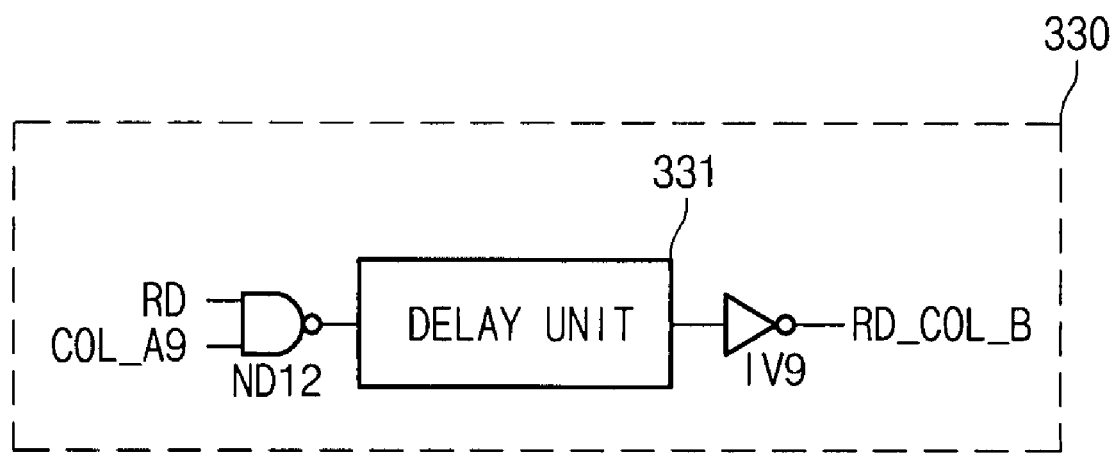
FIG. 5 is a circuit diagram illustrating a read address control unit of FIG. 3.

FIG. 5 illustrates read address control unit 330 of FIG. 3.

Read address control unit 330 includes a NAND gate ND12, a delay unit 331, and an inverter IV9. NAND gate ND12 performs a NAND operation on read signal RD and column address code signal COL_A9. Delay unit 331 delays an output signal of NAND gate ND12 for a given time. Inverter IV9 inverts an output signal of delay unit 331 to output address control signal RD_COL_B.

Detailed circuits of delay units 322, 324, and 331 can be embodied with an inverter delay. Also, the detailed circuits of delay units 322, 324, and 331 can be embodied with a combination of an inverter, a resistor, a capacitor, or a MOS transistor. Delay units 322, 324, and 331 pass the corresponding data in the corresponding column in the read operation.

Although a row address is replaced with a column address in the embodiment consistent with the present invention, a column address can be replaced with a row address in a DDP structure or depending on an address specification.

As described above, consistent with an embodiment of the present invention, when a DDP includes many single chips, a DDP address which is not defined in the specifications of a single chip is easily generated with an external address to increase the efficiency of the DDP.

The foregoing description of various embodiments consistent with the present invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A semiconductor package for forming a Double Die Package (DDP) with a plurality of single chips, comprising:
   a buffer configured to buffer an external address to generate a row address which is defined only in a DDP mode;
   a column address control unit configured to replace the row address with a column address, which is defined only in a single chip mode; and
   a read operation control unit configured to output the row address latched in an active bank as a bank read signal in a read mode of the DDP, and to selectively activate a first address control signal and a second address control signal for activating a bank selected from the single chip or the DDP in response to the bank read signal.

2. The semiconductor package according to claim 1, wherein the buffer buffers a mode control signal for controlling the external address and the operation mode to selectively output a DDP activating signal.

3. The semiconductor package according to claim 2, wherein the buffer buffers the external address in response to the mode control signal to enable the DDP activating signal for operating the DDP.

4. The semiconductor package according to claim 1, wherein the column address control unit comprises:
   a DDP control unit configured to inactivate a mode control signal in the single chip mode and to activate the mode control signal in the DDP mode; and
   a column address counter configured to selectively disconnect the column address in response to the mode control signal.

5. The semiconductor package according to claim 4, wherein the DDP control unit is configured to combine a first mode control signal activated in the DDP mode with a mode signal activated in the single chip mode to output a second mode control signal.

6. The semiconductor package according to claim 5, wherein the first mode control signal has an opposite phase to that of the second mode control signal.

7. The semiconductor package according to claim 4, wherein the column address counter outputs a column address code signal for disconnecting the column address in inactivation of the mode control signal.

8. The semiconductor package according to claim 1, wherein the read operation control unit comprises:
   a read control unit configured to output the row address latched in the active bank as the bank read signal in the read mode of the DDP; and
   a read operation control means configured to selectively activate the first address control signal and the second address control signal for activating the bank selected in the single chip or the DDP in response to the bank read signal.

9. The semiconductor package according to claim 8, wherein the read control unit comprises a plurality of logic elements each configured to logically combine a CAS signal with a bank address to output the bank read signal.

10. The semiconductor package according to claim 8, wherein the read operation control means comprises:
    a first read address control unit configured to output the first address control signal in response to the bank read signal, a first column address code signal activated in the single chip mode, a mode control signal, and a read signal; and
    a second address control unit configured to output the second address control signal in response to the read signal and a second column address code signal activated in the single chip mode.

11. The semiconductor package according to claim 10, wherein the first read address control unit outputs the first address control signal in response to the first column address code signal when the mode control signal and the bank read signal are inactivated in the read mode of the single chip.

12. The semiconductor package according to claim 10, wherein the second read address control unit outputs the second address control signal in response to the second column address code signal in the read mode of the single chip.

13. The semiconductor package according to claim 10, wherein the first read address control unit outputs the first address control signal in response to the bank read signal when the first column address code signal is inactivated in the read mode of the DDP.

14. The semiconductor package according to claim 10, wherein the first read address control unit comprises:
    a first logic combination unit configured to logically combine the first column address code signal, the read signal, and the mode control signal;
    a first delay unit configured to delay an output signal of the first logic combination unit;
    a second logic combination unit configured to logically combine the mode control signal, the bank read signal, and the read signal;
    a second delay unit configured to delay an output signal of the second logic combination unit; and
    a third logic combination unit configured to logically combine an output signal of the second delay unit with an output signal of the first delay unit to output the first address control signal.

15. The semiconductor package according to claim 10, wherein the second read address control unit comprises:
    a first logic element configured to logically combine the second column address code signal with the read signal;

a third delay unit configured to delay an output signal of the first logic element; and an inverter configured to invert an output signal of the third delay unit to output the second address control signal.

16. The semiconductor package according to claim 1, wherein the single chip is a 512M×8 chip.

17. The semiconductor package according to claim 16, wherein the DDP is a 1G×16 chip.

18. The semiconductor package according to claim 1, wherein the row address is A13 defined in the DDP, the DDP being a 1G×16 chip.

19. The semiconductor package according to claim 18, wherein the column address is A11 defined in the single chip, the single chip being a 512M×8 chip.

20. The semiconductor package according to claim 1, wherein the DDP is a 1G×16 chip that includes two single chips that are 512M×8 chips.

* * * * *